(12) United States Patent
Link et al.

(10) Patent No.: US 9,536,021 B1
(45) Date of Patent: Jan. 3, 2017

(54) SYSTEM AND METHOD FOR PROVIDING A RENEWABLE ENERGY NETWORK OPTIMIZATION TOOL

(71) Applicant: Northrop Grumman Systems Corporation, Falls Church, VA (US)

(72) Inventors: Robert Link, Springfield, VA (US); Duane Apling, Ashburn, VA (US); Randall J. Arlliss, Chantilly, VA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 718 days.

(21) Appl. No.: 13/746,989

(22) Filed: Jan. 22, 2013

Related U.S. Application Data

(60) Provisional application No. 61/588,555, filed on Jan. 19, 2012.

(51) Int. Cl.
*G06G 7/54* (2006.01)
*G06F 17/50* (2006.01)

(52) U.S. Cl.
CPC ................ *G06F 17/5009* (2013.01)

(58) Field of Classification Search
None
See application file for complete search history.

(56) References Cited

U.S. PATENT DOCUMENTS

2010/0293045 A1* 11/2010 Burns et al. ............... 705/14.11
2013/0041636 A1* 2/2013 Craig et al. ...................... 703/2

OTHER PUBLICATIONS

Gandomkar et al. A Combination of Genetic Algorithm and Simulated Annealing for Optimal DG Allocation in Distribution Networks CCECE/CCGEI, Saskatoon, May 2005, IEEE.*
Kratica et al. Solving the Simple Plant Location Problem by Genetic Algorithm Rairo Operations Research 35, 2001, pp. 127-142.*
Tsili et al. A Review of Grid Code Technical Requirements for Wind Farms IET Renewable Power Generation, 2009.*

(Continued)

*Primary Examiner* — Omar Fernandez Rivas
*Assistant Examiner* — Cuong Luu
(74) *Attorney, Agent, or Firm* — Andrews Kurth Kenyon LLP

(57) ABSTRACT

Embodiments of a system and method are disclosed for providing a renewable energy network optimization tool. A method for optimizing a renewable energy network determines an initial configuration state, populates a pool of candidate sites for placement of renewable-energy generating units a hybrid simulated annealing-genetic algorithm, constructs a plurality of candidate renewable energy generation networks from the pool of candidate sites using random selection, evaluates the candidate renewable energy generation networks using scoring metrics, ranks the evaluated candidate renewable energy generation networks with respect to each other and prior iteration candidate renewable energy generation networks, adds candidate sites from a top ranked candidate renewable energy generation network to a list of candidate sites to be kept repeats the above until a final best candidate renewable energy generation network of kept sites is determined.

17 Claims, 15 Drawing Sheets

(56) References Cited

OTHER PUBLICATIONS

Prest et al. Using GIS to Evaluate Impact of Exclusion Zones on the Connection Cost of Wave Energy to the Electricity Grid Energy Policy 35, 2007, pp. 4516-4528.*

Maaranen et al. Quasi-Random Initial Population for Genetic Algorithm Computers and Mathematics with Applications 47, 2004, pp. 1885-1895.*

* cited by examiner

| CORRELATIONS BETWEEN NREL WIND DATA AND RENOT WIND DATA FROM 2004-2006 ||
|---|---|
| SITE 1 | 0.68 |
| SITE 2 | 0.61 |
| SITE 3 | 0.68 |
| SITE 4 | 0.70 |

*FIG. 2C*

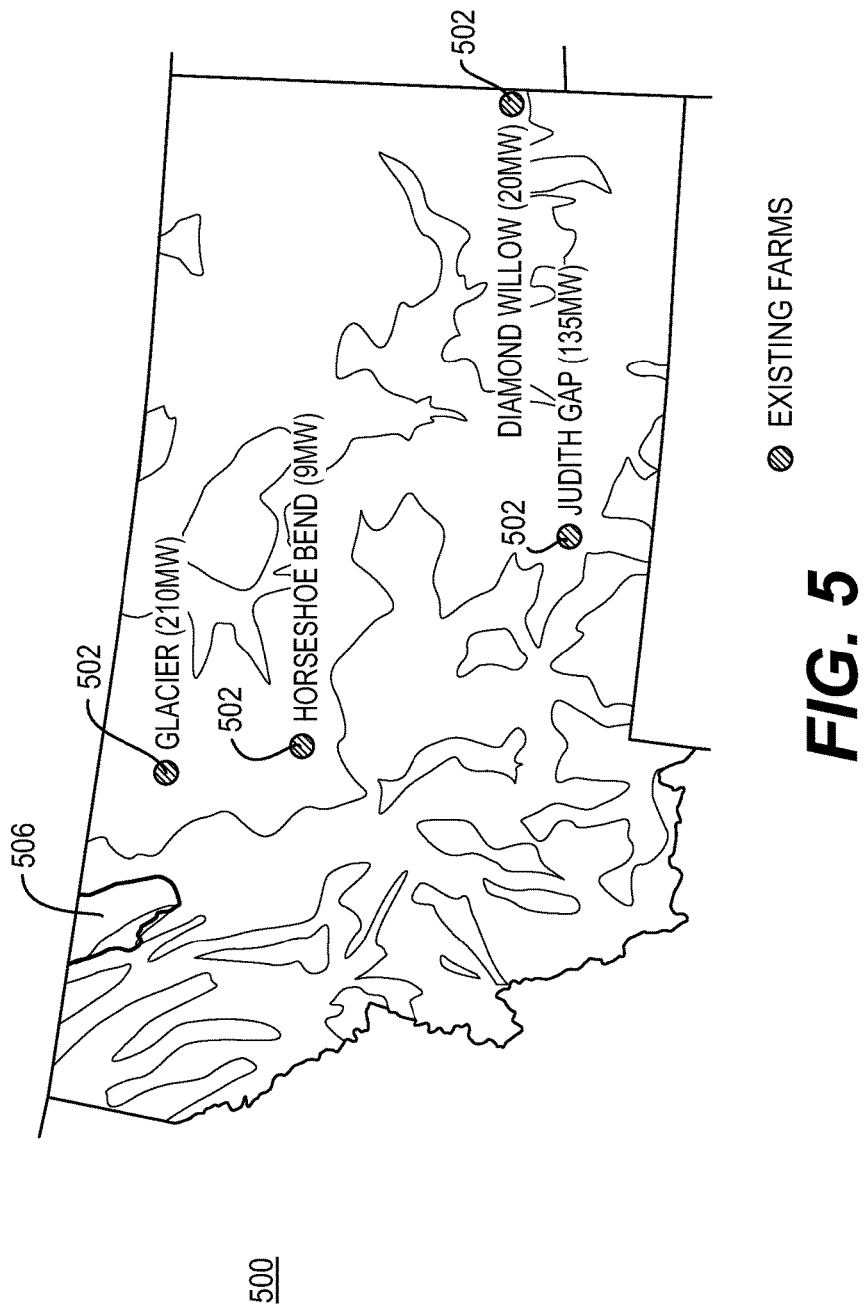

| SITE CONFIGURATION | RAW POWER (MW) | USABLE POWER (MW) | RAMPING 10% (%) |
|---|---|---|---|
| JUDITH GAP, HORSESHOE BEND, GLACIER, D. WILLOW (USE NAME PLATE VALUES) | 85 | 63 | 2.5 |
| JUDITH GAP, HORSESHOE BEND, GLACIER, D. WILLOW (USE EQUAL POWER 93.5MW) | 81 | 63 | 2.1 |
| RENOT (CLOSEST NETWORK) | 124 | 101 | 1.0 |
| RENOT (HIGHEST POWER) | 125 | 99 | 1.7 |
| RENOT (HIGHEST STABILITY) | 121 | 98 | 1.9 |
| RENOT (USING EQUAL POWER, 93.5MW) | 122 | 100 | 1.3 |

*FIG. 6B*

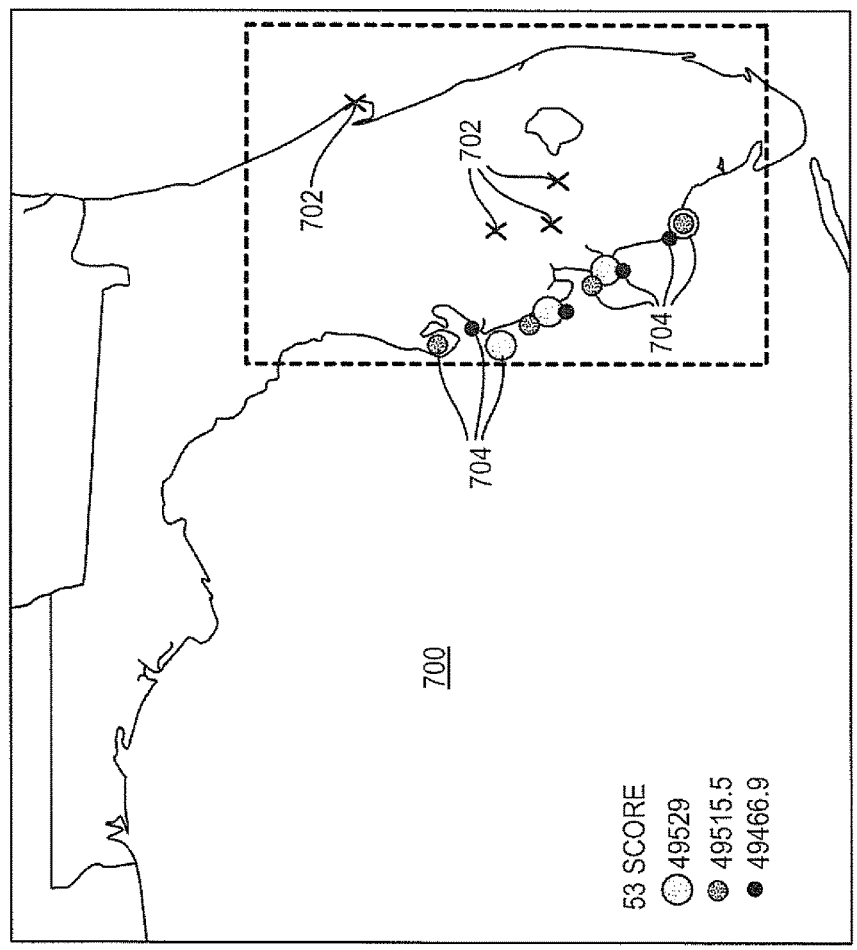

| SITE CONFIGURATION | RAW POWER (MW) | USABLE POWER (MW) | RAMPING 10% |
|---|---|---|---|
| DESOTO, SPACE COAST, TWO PROPOSED SITES (145 MW) | 86.8 | 77.6 | 34.0 |
| RENOT NETWORK (145MW) | 92.1 | 85.6 | 33.1 |

*FIG. 7B*

| PROBABILITY OF POWER OUTPUT EXCEEDING A GIVEN VALUE | | | | |
|---|---|---|---|---|
| | 50% | 75% | 90% | 99% |
| 7AM-8AM | 91.95 | 66.38 | 33.95 | 8.63 |
| 8AM-9AM | 127.25 | 100.53 | 54.40 | 16.87 |
| 9AM-10AM | 138.75 | 108.05 | 67.25 | 25.10 |
| 10AM-11AM | 144.05 | 112.48 | 74.90 | 34.77 |
| 11AM-12PM | 156.20 | 125.00 | 89.30 | 47.10 |
| 12PM-1PM | 158.00 | 125.93 | 87.80 | 53.20 |
| 1PM-2PM | 152.60 | 114.93 | 77.10 | 50.97 |
| 2PM-3PM | 139.50 | 100.20 | 56.15 | 42.47 |
| 3PM-4PM | 117.55 | 71.40 | 37.50 | 31.77 |
| 4PM-5PM | 91.10 | 48.05 | 22.70 | 20.57 |
| 5PM-6PM | 56.40 | 26.13 | 11.60 | 10.70 |
| 6PM-7PM | 21.50 | 8.43 | 4.30 | 3.67 |

*FIG. 9A*

| PROBABILITY OF POWER OUTPUT EXCEEDING A GIVEN VALUE | | | | |
|---|---|---|---|---|
| | 50% | 75% | 90% | 99% |
| 7AM-8AM | 106.65 | 80.00 | 39.60 | 9373 |
| 8AM-9AM | 138.95 | 110.43 | 60.25 | 18.27 |
| 9AM-10AM | 143.05 | 113.65 | 66.65 | 26.30 |
| 10AM-11AM | 144.40 | 113.13 | 66.15 | 36.53 |
| 11AM-12PM | 153.65 | 118.15 | 69.50 | 48.73 |
| 12PM-1PM | 154.60 | 113.30 | 69.30 | 54.10 |
| 1PM-2PM | 143.60 | 101.23 | 59.05 | 51.50 |
| 2PM-3PM | 126.45 | 71.70 | 47.30 | 42.50 |
| 3PM-4PM | 101.60 | 52.13 | 34.80 | 31.70 |
| 4PM-5PM | 67.85 | 33.93 | 21.00 | 20.33 |
| 5PM-6PM | 41.45 | 17.80 | 11.20 | 10.60 |
| 6PM-7PM | 15.20 | 6.73 | 4.10 | 3.60 |

*FIG. 9B*

| SITE CONFIGURATION | 4KM USABLE POWER (MW) | 1KM USABLE POWER (MW) |
|---|---|---|
| DESOTO, SPACE COAST, TWO FP&L PROPOSED SITES (145 MW) | 72.8 | 79.4 |
| RENOT NETWORK (145 MW) | 86.9 | 92.6 |

*FIG. 10*

SYSTEM AND METHOD FOR PROVIDING A RENEWABLE ENERGY NETWORK OPTIMIZATION TOOL

BACKGROUND

As the renewable energy industry continues to grow so does the requirement for atmospheric modeling and analysis tools to maximize both wind and solar power. Renewable energy generation is variable, however, presenting challenges for electrical grid operation and requiring a variety of measures to adequately provide power. These measures include the production of non-renewable generation during times when renewables are not available.

Typically, renewable energy generation sites and networks have been placed and created based on limited data and without significant thought given to optimizing the production of energy from such networks. Often, the efficiency and stability of power generation has not been the driving factor for selection of renewable energy generation sites, such as wind farms and solar collection farms. This has lead to failed projects and lower returns on investments.

What is needed is a tool that optimizes the selection of renewable energy generation sites and the creation of optimal networks for renewable energy generation.

SUMMARY

Embodiments of a system and method overcome the disadvantages of the prior art and provide a tool that optimizes the selection of renewable energy generation sites and the creation of optimal networks for renewable energy generation. These advantages and others are provided by, for example, a method for optimizing a renewable energy network determines an initial configuration state, in that initial configuration state includes information about any renewable energy candidate sites kept from a prior iteration, if any, populates a pool of candidate sites for placement of renewable-energy generating units a hybrid simulated annealing-genetic algorithm, in that the populating includes adding identified kept sites and adding candidate sites by quasi-random geographical selection, constructs a plurality of candidate renewable energy generation networks from the pool of candidate sites using random selection, evaluates the candidate renewable energy generation networks using scoring metrics, ranks the evaluated candidate renewable energy generation networks with respect to each other and prior iteration candidate renewable energy generation networks, adds candidate sites from a top ranked candidate renewable energy generation network to a list of candidate sites to be kept repeats the above until a final best candidate renewable energy generation network of kept sites is determined.

These advantages and others may also be provided by a system for providing a renewable energy network optimization tool. The system includes one or more processors; and a memory connected to the one or more processors, wherein the memory includes instructions for optimizing a renewable energy network, by determining an initial configuration state, in that initial configuration state includes information about any renewable energy candidate sites kept from a prior iteration, if any, populating a pool of candidate sites for placement of renewable-energy generating units a hybrid simulated annealing-genetic algorithm, in that the populating includes adding identified kept sites, an adding candidate sites by quasi-random geographical selection, constructing a plurality of candidate renewable energy generation networks from the pool of candidate sites using random selection, evaluating the candidate renewable energy generation networks using scoring metrics, ranking the evaluated candidate renewable energy generation networks with respect to each other and prior iteration candidate renewable energy generation networks, adding candidate sites from a top ranked candidate renewable energy generation network to a list of candidate sites to be kept, and repeating the above until a final best candidate renewable energy generation network of kept sites is determined.

These advantages and others may also be provided by a non-transitory computer readable medium providing instructions for optimizing a renewable energy network. The instructions determine an initial configuration state, in that initial configuration state includes information about any renewable energy candidate sites kept from a prior iteration, if any, populate a pool of candidate sites for placement of renewable-energy generating units a hybrid simulated annealing-genetic algorithm, in that the populating includes adding identified kept sites and adding candidate sites by quasi-random geographical selection, construct a plurality of candidate renewable energy generation networks from the pool of candidate sites using random selection, evaluate the candidate renewable energy generation networks using scoring metrics, rank the evaluated candidate renewable energy generation networks with respect to each other and prior iteration candidate renewable energy generation networks, add candidate sites from a top ranked candidate renewable energy generation network to a list of candidate sites to be kept, and repeat the above until a final best candidate renewable energy generation network of kept sites is determined.

DESCRIPTION OF THE DRAWINGS

The detailed description will refer to the following drawings, wherein like numerals refer to like elements, and wherein:

FIG. 2C is a table illustrating a correlation between a NREL western wind dataset and a dataset developed for embodiments described herein;

FIG. 5 is a diagram illustrating exemplary locations of four wind farms in Montana with a total name plate capacity of 374 MW;

FIG. 6B shows statistics from an application of an embodiment of an optimization executed by an embodiment of the renewable energy network optimization tool;

FIG. 7A is a diagram illustrating exemplary results generated by an embodiment of the renewable energy network optimization tool for a solar power optimization study over Central and Southern Florida;

FIG. 7B shows statistics from an application of an embodiment of an optimization executed by an embodiment of the renewable energy network optimization tool;

FIGS. 9A and 9B show the probability of exceeding different usable power values for an (a) optimized network and an (b) existing/proposed network;

FIG. 10 shows optimization results using different cloud data, illustrating the impact of satellite resolution might have on the results;

DETAILED DESCRIPTION

Figure 1:
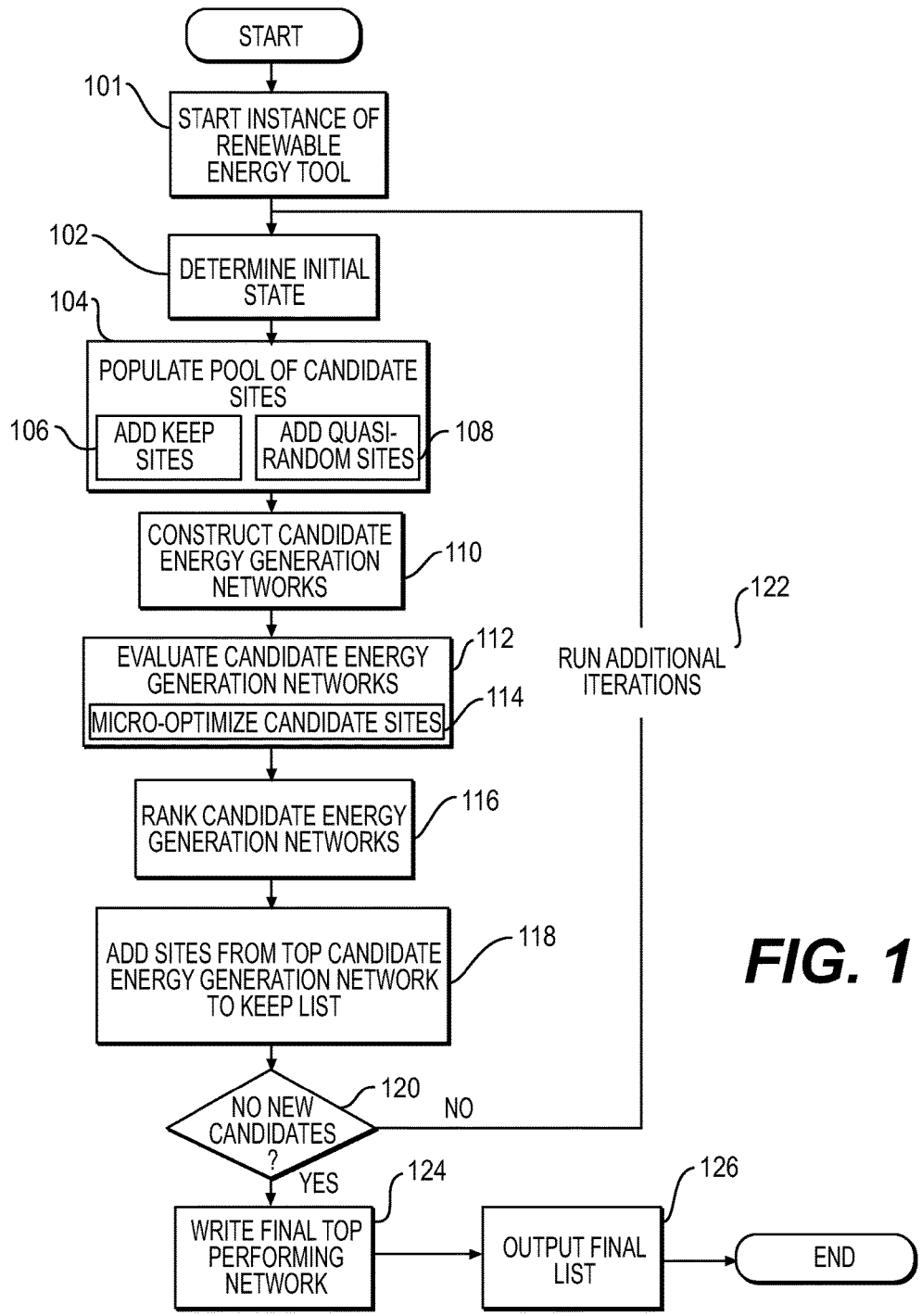
FIG. 1 is a flowchart illustrating a flow chart illustrating an embodiment of a method for renewable energy optimization performed by embodiments of a renewable energy optimization tool.

Described herein are embodiments of a system and method for providing a renewable energy network optimization tool. As noted above, as the renewable energy industry continues to grow, so does the requirement for atmospheric modeling and analysis tools to maximize both wind and solar power. Renewable energy generation is variable, presenting challenges for electrical grid operation and requiring a variety of measures to adequately provide power. These measures include the production of non-renewable generation during times when renewables are not available.

A similar problem faces government organizations interested in space to ground laser communications. Clouds severely attenuate a free space optical communication (FSOC) signal. Therefore, in order to achieve maximum link performance, a user needs to use site diversity techniques to find optimal ground stations. The Lasercom Network Optimization Tool (LNOT) modeling system may be used to perform site selection and availability trade studies. This LNOT modeling system has been accomplished through the development of a fifteen-year climatological and high resolution cloud database based on geostationary satellite imagery.

The inventors recognized that the site-diversity strategy developed for laser communications may be used to mitigate the intermittency in alternative energy production systems while still maximizing saleable energy. In embodiments described herein, LNOT has been adapted and used by a tool designed to optimally site potential wind turbine and solar collector farms. Embodiments of the renewable energy network optimization tool may be referred to as the renewable energy network optimization tool (ReNOT). Although the problem faced by embodiments described herein is different than for FSOC, the modeling framework in LNOT is easily extendable. Embodiments of ReNOT may have a plug-in architecture that allows a user to accommodate a wide variety of renewable energy system designs and performance metrics. For example, a user may optimize site locations to maximize day ahead predictable power all the while accounting for short term variability.

One strategy for minimizing the variability of renewable energy production is site diversity (also referred to as geographical diversity). Assuming that a network of renewable energy systems feed a common electrical grid, site diversity ensures that when one system on the network has a reduction in generation others on the same grid may make up the difference.

Specifically, constrained network optimization depends on multiple variables, such as source environmental data, source feasibility masks, and input configurations and constraints on power production type, turbine and/or panel characteristics, and minimum/maximum power generation allocation limits by site, including preexisting sites.

Embodiments of a system and method provide a renewable energy network optimization tool to address the inherent variability that exists with both wind and solar power generation. Currently all renewable sites are located in only resource rich areas, consequently greatly increasing the problem of load balancing. Embodiments of the renewable energy network optimization tool use geographical diversity to mitigate the variability problem and ease the burden of load balancing on the electrical grid.

Embodiments of the renewable energy network optimization tool provide a disruptive technology in that embodiments attack the problem of large scale deployment from a macro scale, addressing the variability issue and maximizing the usable power of a network of renewable energy sites. This is accomplished through a unique optimization method and historical high resolution wind/cloud climatology.

Embodiments of a system and method provide a renewable energy network optimization tool that may be executed in a multiprocessing computing environment in which a master thread of execution controls and coordinates optimization activities of a mass of slave execution threads.

With reference now to FIG. 1, shown is a flowchart of a method 100 for optimizing renewable energy networks that may be used by embodiments of a renewable energy network optimization tool. Embodiments may provide a renewable energy network optimization tool that performs method 100. The renewable energy network optimization tool may be implemented as a software program, e.g., running in a multiprocessor computing environment, that runs multiple threads, including a master thread and slave threads, to perform method 100.

Method 100 may begin by starting or instantiating an instance of a renewable energy network tool, block 101. An embodiment of the renewable energy network optimization tool may utilize time sequential iterations, in which either the initial configuration state, or the state resulting from a prior iteration, is acted upon by the master thread. Method 100, therefore, begins an iteration by master thread determining the initial state, block 102. Initial state for an iteration may be the initial configuration state, for the first iteration, or the state resulting from the prior iteration. An action of the master thread is to populate a pool of candidate sites, block 104, using a hybrid simulated annealing-genetic algorithm. Sites are candidates based on two criteria: (1) a site is identified as a keep site from the prior state by virtue of being a member site of a top-scored network. These sites are the inherited component of the "gene pool" in the genetic algorithm. The number of keep sites may be a specified user parameter, following a specified annealing schedule, which may be selectively based on elapsed time of the simulation or a number of prior iterations executed; and, (2) a site is added to the pool by quasi-random geographical selection to fill out the pool to a total size specified by the annealing schedule. These sites are the mutation component of the "gene pool" in the genetic algorithm. Consequently, the annealing schedule controls the ratio of inherited to mutated genes in the genetic algorithm and populating 104 the pool of candidate sites may include adding identified keep sites from prior state, block 106, and adding sites to the pool by quasi-random geographical selection, block 108.

An annealing schedule may have three major characteristics: (1) an annealing schedule may have an initial broad search phase, where the pool begins at a smaller keep-site size and larger total size specified by the user, and grows the number of keep-sites, as iterations occur and/or wall-time progresses, up to near the total size specified by the user. This accomplishes a global search of the parameter-space and is an analogue of the high-temperature phase in a stochastic simulated annealing optimization; (2) an annealing schedule may have a further focused search phase, where both the number of keep-sites and total size of the pool are reduced one-for-one, down to where the keep-site count is the user-specified number of stations constraint, and the total size is a computed value allowing for full combinatorial exploration of the pool given the slave thread count configuration in a single iteration. This is an analogue of a cooling process in a stochastic simulated annealing optimization; and, (3) an annealing schedule may have a final, local, descent phase, where the final pool size configuration of keep-sites and total sites is processed until the allocated iteration or wall-time elapse. This characteristic may implement a steepest descent process within the discrete sites state-space.

With continued reference to FIG. 1, the quasi-random site generation process improves rate of convergence of all three phases of annealing. Physical insight into the optimization problem for atmospheric effects, such as winds and clouds, leads to a conclusion that geographic diversity in general, and specifically geographic diversity thorough sampling for uniform coverage, will lead to identifying better performing site configurations earlier in the optimization process. Output from classical pseudo-random number generators expressed as latitude and longitude vector pairs, while geographically diverse, fails to meet the criterion of thorough geographical coverage. Sobol-sequence generators in contrast are quasi-random, a term indicating both pseudo-randomness and space-filling properties in a single multi-dimensional generator. Use of a two-dimensional Sobol-sequence generator to more thoroughly sample the parameter space leads to vastly improved rates of convergence of the optimization. Consequently, embodiments of method 100 may use a Sobol-sequence generator to perform the quasi-random geographical selection 108. As with pseudo-random number generators, output will typically by expressed as latitude and longitude vector pairs identifying the candidate site.

In embodiments of method 100, slave threads may construct a number of candidate energy generation networks using random selection, block 110. In embodiments of method 100, candidate networks are generated 110 without replacement to ensure sites from the pool are not repeated within a single candidate network. As discussed below, embodiments may permit replacement and allow candidates to be repeated in a candidate network. In embodiments, slave threads evaluate candidate networks by each of the selected candidate sites within the candidate networks, block 112. The local site evaluation 112 may include micro-optimization of allocated capacities within the allowed constraints for each site, block 114. This unique innovation isolates two largely independent portions of the full optimization space from each other, reducing search dimensionality and speeding convergence of both. A steepest descent process is used to implement micro-optimization 114 of allocated capacities on individual sites making up a candidate solution before the final score for the solution is reported for competition. This micro-optimization 114 maximizes the score for the specific site configuration while meeting, e.g., user-specified, constraints on minimum and maximum capacity per site.

In an embodiment, micro-optimization 114 may use a variety of scoring metrics to generate a score for each site. Several scoring metrics developed for the micro-optimization 114 show the flexibility of the optimization for meeting various user-needs. A score for bulk aggregate performance sums the total energy production of a network. A bounding score showing the total energy production over time, but only resulting from the single lowest instantaneously performing site illustrates maximal effects of site diversity. A scoring metric that only aggregates energy produced up to the lesser of the minimum raw power produced in the last hour, and the power predicted to have been produced 24 hours in advance maximizes site selection for short-term stability and day-ahead forecastability. A scoring metric that differentially weights power produced above and below a load-following curve optimizes site selection to reduce network ramping and ease integration of power onto local and regional power grids.

Once the candidate networks are evaluated 112 and micro-optimized 114, the candidate networks may be passed back to the master thread. In addition to the expected performance metrics and optimization described below, candidate networks may also be evaluated based on practical restrictions, for example, building in state parks, population centers or proximity to electrical grid infrastructure. For example, if a candidate site is in a no-build area (e.g., a national park), it may be given a low score or simply removed from consideration. Based on the evaluation 112 and micro-optimization 114, the candidate networks may be ranked in a output list, block 116. Member sites or stations of the top performing network or networks (as compared to all candidate networks generated in various iterations of method 100) are added to the keep-list, block 118, e.g., by the master thread. Additional iterations of method 100 may be run to further optimize the top performing network or networks, block 122. When a set number of iterations has been run or when method 100 determines no new candidate sites have been added to the keep-list, block 120, embodiments of the renewable energy network optimization tool may shut down slave threads and write (e.g., to memory) a final top performing network or list of top performing networks, block 124, and output the final list for user or automated review, block 126.

To sum, in embodiments of system and method 100 for providing a renewable energy network optimization tool, processing of a full iteration may proceed as follows. After determining 102 the initial site, master thread fills 104 the site pool by adding keep sites 106 and adding sites through quasi-random geographic selection 108 as specified by the annealing schedule. Master thread may pass this pool to each of the slave threads. Slave threads construct 110 numbers of candidate networks from the pool using random selection without replacement to ensure sites from the pool are not repeated within a single candidate network. Candidate networks are evaluated 112 for the selected score using a micro-optimization method 114. These micro-optimized candidate networks may be passed back to the master thread, where the top-performing networks are listed 116 in a ranked output list, and the member stations of the top performing networks are added 118 to the keep-list to be passed to the following iteration. Above steps of method 100 may be repeated to run additional iterations, block 120.

Finally, embodiments of a system and method that provide a renewable energy network optimization tool shut down the slave threads and write 122 the final list of top performing networks to output 124 for (e.g., a user's or automated) review.

Several aspects of the renewable energy network optimization tool capability are described below, including datasets, optimization methods, and a scoring method that may be used (both solar and wind) by embodiments described herein. Several case studies of both wind and photovoltaic (PAT) farm deployment are also described below.

Data Set Used in the Renewable Energy Network Optimization Tool

The cloud database needed to run an embodiment of the renewable energy network optimization tool have been developed originally for the FSOC problem. Fifteen years of GOES imagery over the Continental United States and Hawaii have been run through a custom cloud retrieval process to provide cloud properties at 4 km horizontal and 15 minute temporal resolution, respectively. Cloud analyses from the NOAA GOES imager data are derived using the methods described "Introducing the Renewable Energy Network Optimization Tool (ReNOT): Part 1," Alliss et al. (2011) ("Alliss I"), which is incorporated herein by reference. The GOES imager has five (5) bands: visible (0.6 µm), shortwave infrared (3.9 µm) (SWIR), water vapor (6.7 µm), long wave infrared (10.7 µm) (LWIR), and split window (11.2 µm). The water vapor channel, is not used for cloud detection and is replaced by a multi-spectral fog product at night, and a shortwave reflectivity product during the day. The resolution of the visible band is one (1) km, and the other bands are at four (4) km. In the cloud detection process the one (1) km data is re-sampled to four (4) km so that it may be readily combined with the data from the other bands.

The existing high-resolution cloud cover database is coupled with a sophisticated solar irradiance model to provide the basic databases needed for the site selection of solar energy farms.

In addition, the Weather Research and Forecasting Model (WRF) is used to develop a climatological wind database. Below is a brief description of the cloud retrieval process as well as the wind database development.

Clear Sky Background

The cloud retrieval process uses threshold tests to determine the presence of clouds and needs knowledge of a clear sky background (CSB). The CSB is the radiation received by the GOES sensor in the absence of clouds. This background can be reflected, emitted, or a combination of both. The reflective and emissive properties of the ground vary from place to place. Therefore, using fixed thresholds in the cloud tests will produce faulty cloud decisions in some places. For example, an albedo threshold tuned to detect clouds over "typical" terrain will consistently produce spurious clouds over the highly reflective surface of White Sands, N. Mex. Similarly, seasonal variations in ground temperature will affect the LWIR background. Terrain height, soil moisture, and illumination angle also affect the CSB. In order to account for these differences, the CSB may need to be modeled separately for each pixel at each time.

In order to minimize the effects of diurnal cycles, the CSB is processed using data from the previous thirty (30) days at a single analysis time (e.g., 1200 UTC). This scheme isolates most of the diurnal variation in temperature and illumination. A separate CSB is calculated for each band or multi-spectral product in use at the particular analysis time: LWIR, visible, reflectivity product, and fog product.

The albedo CSB is the average of the darkest ten percent of albedo values from the previous thirty (30) days for the pixel being analyzed. The thirty-day data window represents a compromise between making the sample large enough to be likely to include several clear observations and making the sample small enough to be sensitive to seasonal variations.

The reflectivity CSB is calculated using the darkest ten percent of reflectivity product values from the previous thirty (30) days. The calculation is in other respects similar to the calculation for the albedo CSB.

The fog product CSB is calculated by identifying the warmest ten percent (10%) of LWIR values for the pixel over the previous thirty (30) days. The fog product values for the selected times are averaged to form the fog product CSB. This procedure differs from the albedo and reflectivity versions (which choose clear pixels based on the albedo and reflectivity themselves) because both extremes of the fog product values indicate clouds.

The LWIR CSB is determined with the aid of the LWIR regression model, in which each pixel's LWIR temperature is estimated using a linear regression model. The regression model is populated with prototypical clear sky pixels from the entire analysis region. These prototypes are chosen using a series of tests that detect only pixels that have a high probability of being clear (i.e., even without the benefit of thresholds from the regression modeling they are clearly cloud-free). The prototype pixels are used to fit coefficients of a linear regression model with twelve predictors, including pixel level data from the GOES imager, regional data from the NWS surface reports, time, and terrain.

The LWIR regression model is used to estimate the clear sky LWIR brightness temperature in each pixel. The differences between the regression model temperature and the measured GOES LWIR temperature are the LWIR residuals. The warmest ten percent of the LWIR residuals are averaged to obtain the LWIR residual CSB that is used in the LWIR cloud test.

Cloud Tests

All of the cloud tests are made by comparison to a dynamically computed CSB, described in the previous section.

The visible channel is used when the solar zenith angle is less than eighty-nine degrees (89°). However, for solar zenith angles between eighty-nine degrees (89°) and eighty-one degrees (81°) cloud detections in this band are de-weighted, due to the low signal-to-noise ratio when the scene is illuminated at low solar elevations. If the calculated albedo exceeds the CSB by a predefined threshold, the pixel is deemed cloudy. Conversely, if the albedo is less than the CSB by more than the threshold, the pixel is deemed clear (i.e., cloud detections from other tests may be negated).

The LWIR is used directly in a cloud detection test, in addition to being used in the multi-spectral tests. A pixel is considered cloudy if the LWIR CSB for the pixel exceeds the LWIR temperature by a predefined threshold. Unlike the visible and multi-spectral tests, the LWIR test is usable at any time of day.

The fog product is calculated as the difference between the LWIR and SWIR brightness temperatures. The emissivity of water clouds in the SWIR is lower than in the LWIR; therefore, low clouds produce colder SWIR temperatures, resulting in $T_{LW}-T_{SW} \geq 2K$. (The exact threshold is determined by the clear-sky background model described below.) This product can detect clouds that have LWIR temperatures too similar to the ground temperature to be detected by the LWIR alone. The fog product is also useful for detecting high ice clouds. These clouds are transmissive and therefore appear warmer in the SWIR, resulting in $T_{LW}-T_{SW} \leq 5K$. Because the SWIR is dominated by reflected radiation during the day, the fog product is usable only at night.

The shortwave reflectivity product is calculated by subtracting the thermal component from the SWIR, leaving only the reflected solar component. Because water clouds are highly reflective in the SWIR, while ice is poorly reflective in the SWIR, the reflectivity product can readily distinguish between low clouds and snow cover. Absent the reflectivity product, the visible channel could misidentify the latter as cloud.

Exemplary Cloud Analyses

Figure 2A:
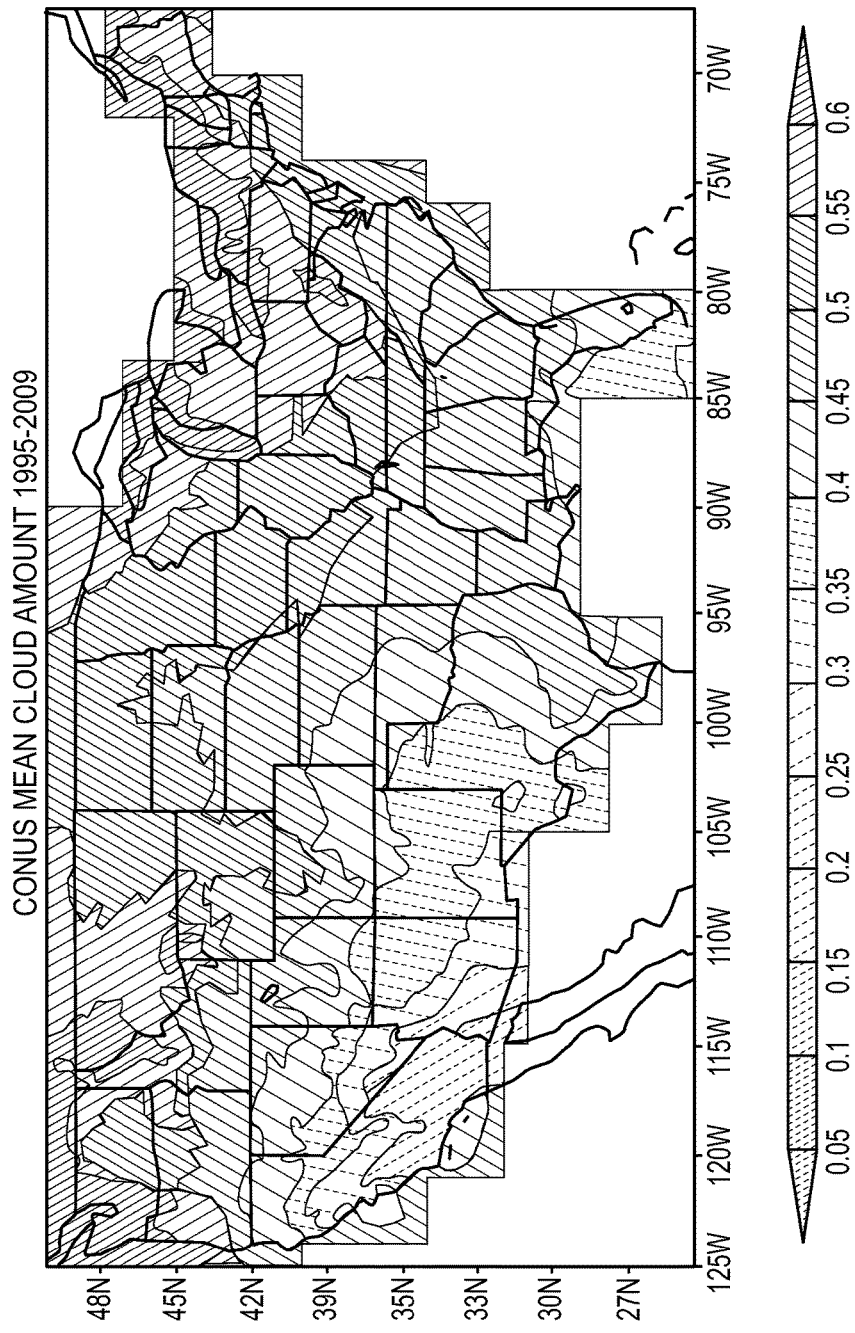
FIGS. 2A and 2B are diagrams illustrating mean cloud occurrence over continental United States and Hawaii, respectively, between 1995 and 2009.
Figure 2B:
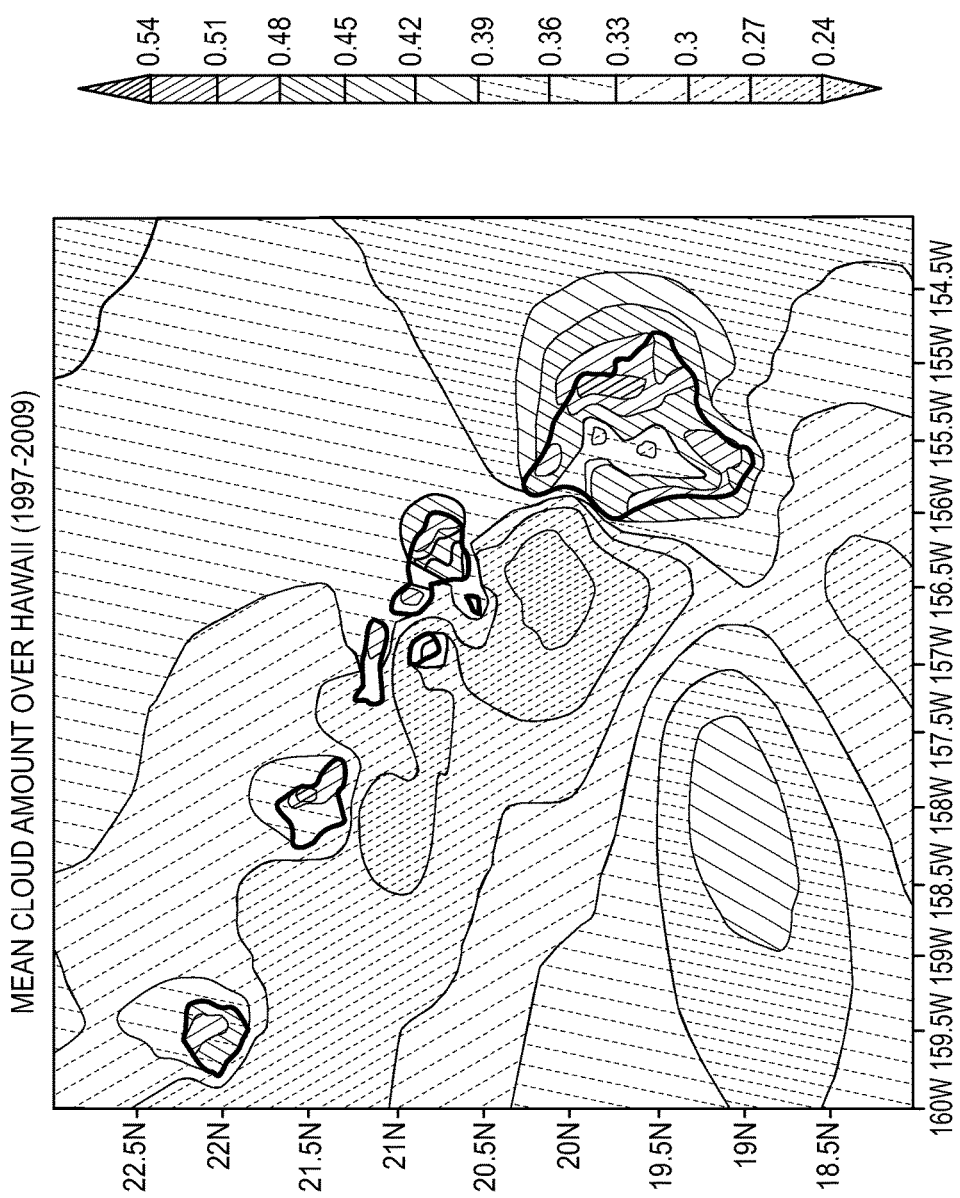

FIGS. 2A and 2B illustrate mean cloud occurrence over continental United States and Hawaii, respectively, between 1995-2009. The climatology indicates a well-known pattern of clouds including the relatively clear Southwest United States and the more persistently cloudy Pacific Northwest and Great Lakes regions. Over Hawaii, the peaks of Mauna Kea, Mauna Loa, and Haleakala all show a characteristic minimum in clouds. In addition, mesoscale features such as the Kona Plume and the local sea-breeze fronts along the Kona coast are evident in their local maximum in cloudiness.

Because this database has a temporal resolution of fifteen (15) minutes, the cloud correlations between sites and in time can be explicitly calculated instead of inferred. The cloud database has been validated against whole sky imager (WSI) over a nine month period as well as pyrheliometer data at multiple locations throughout the United States. Results indicated an excellent agreement between the two datasets. Comparisons were also made to data from a Desoto photovoltaic farm located in Florida. Correlations between the database were approximately 0.7.

The Wind Database

The Weather Research and Forecasting (WRF) mesoscale model is applied to generate high-resolution wind databases to support the site selection of wind farms. These databases are generated on High Performance Computing systems such as the Rocky Mountain Supercomputing Center (RMSC). WRF is a high resolution, limited area, non-hydrostatic model. Decadal simulations with WRF are successfully performed, running in climate mode, for current and future periods over CONUS. A number of features are utilized and implemented in the WRF model to allow realistic representation of the climate system in long-term simulations, e.g. variable $CO_2$ concentrations, diurnal variations of the skin Sea Surface Temperature (SST), deep soil temperature and SST updates. The NCEP reanalysis and the ECHAM5/MPI-OM General Circulation Model (GCM) are used as the forcing model which provide the necessary initial and boundary conditions. For the present climate (1995-2009), WRF was forced with NCEP reanalysis data. For the 21st century climate, an ECHAM5 simulation with the Special Report on Emissions (SRES) A1B emissions scenario may be used. WRF was run in nested mode at spatial resolution of 108 km, thirty-six (36) km and twelve (12) km and twenty-eight (28) vertical levels. The wind speed at approximately forty (40) meters height (hub-height for most wind turbines) is saved every hour. In this study the Single-moment 5-class (WSM5) microphysics scheme and the Kain-Fritsch convective parameterization scheme are utilized. The Noah Land Surface Model and Yonsei University (YSU) Planetary Boundary Layer scheme are used. Shortwave and long wave radiation are computed with the CAM SW and LW scheme.

Comparisons of model output are made to data collected from a wind farm in Montana and show correlations around 0.7. In addition, comparisons were made to wind datasets obtained from the National Renewable Energy Lab (NREL) (see the NREL website). Wind speed data were downloaded for four locations nearest the corresponding WRF grid points for the period 2004-2006. The NREL dataset is valid at 100 meters AGL and one (1) arc-minute spatial and ten (10) minute temporal resolution, respectively. The data were aggregated so they could be more easily compared to the dataset which is valid at twelve (12) km and one (1) hour resolution. Results for the four sites are shown in FIG. 2C.

One skilled in the art will appreciated that the renewable energy network optimization tool can accommodate any other cloud or wind database. In embodiments of the renewable energy network optimization tool, the database should contain a time series of the parameters of interest and not simply means over time of the parameters. In this manner, the correlation between sites can be explicitly resolved in the optimization performed by the renewable energy network optimization tool. In addition, the dataset needs to be gridded spatially. This then makes it possible to substitute a preferred dataset. This make the renewable energy network optimization tool essentially agnostic to the data used for site selection.

Modeling and Optimization Approach

In an embodiment of the renewable energy network optimization tool, in order to translate the cloud data into information useful for computing the incoming solar radiation, a sophisticated solar model and statistics of cloud height/thickness may be used to compute direct and indirect insolation. Insolation is computed using a multi-layer radiative transfer model. The orientation geometry of the solar panels is modeled directly from design specifications of an installed panel systems (e.g., SunPower T0 panels) with a pointing process. In addition, panel-to-panel shadowing is accounted for in the solar calculation. In an example, the solar model was empirically fit to the aggregate power generation data provided from November and December 2009 DeSoto data.

A method for finding an optimal network of renewable energy generating stations, such as method 100 performed by embodiments of the renewable energy network optimization tool, faces two competing goals. First, it must search efficiently through the configuration space by using information gleaned from networks evaluated earlier in the process to guide the search toward even better networks. Second, it must avoid getting trapped in locally optimal solutions, which, though better than other nearby candidates, are inferior to configurations more distant in the configuration space. These goals conflict because using a lot of information from previous evaluations may restrict a user to a more local search. Conversely, searching more broadly through the configuration space precludes a user from taking advantage of what has been discovered about previous configurations already evaluated. A balance is struck between these conflicting goals by adopting some strategies from genetic processes, which provide a systematic way of starting out with a broad search early in the calculation and narrowing in to a more local search as the calculation progresses.

Figure 3:
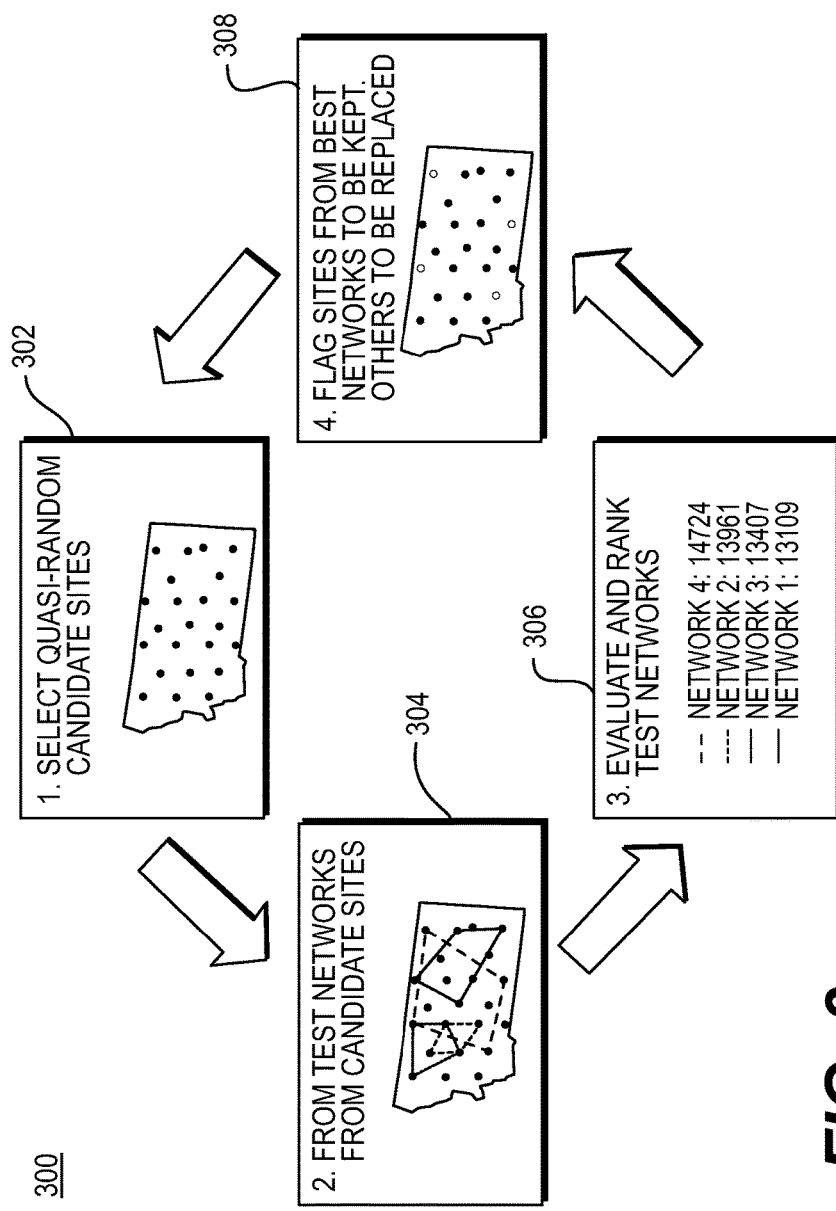
FIG. 3 is a block diagram that graphically illustrates an embodiment of a method for renewable energy optimization performed by embodiments of a renewable energy optimization tool.

FIG. 3 is a block diagram graphically illustrating an exemplary optimization process 300, e.g., performing method 100 described above, which may be performed by an embodiment of the renewable energy network optimization tool. Process 300 includes selecting 302 quasi-random candidate sites, forming 304 test networks from candidate sites, evaluating and ranking 306 test networks, and flagging 308 sites from best networks to be kept (while others are replaced).

Each iteration of the exemplary optimization process 300 shown in FIG. 3 begins by identifying a pool of eligible stations. All of the new networks examined in the iteration will have stations drawn from this pool. The number of stations that remain in the pool from one iteration to the next determines how broad or focused the search will be. Replacing all or most of the stations results in a broader search; replacing only a few results in a more focused search. In the parlance of genetic processes, the station pool represents the gene pool, and the fraction of stations replaced at each iteration represents the mutation rate. Stations are selected 302 for the pool using a quasi-random number generator, instead of the more traditional pseudo-random number generator. Embodiments of the renewable energy network optimization tool allow the stations to be sampled more uniformly across the geographical area of interest, taking advantage of the intuition that the best networks will be geographically diverse.

Once the station pool is in place, networks may be created 304 for evaluation by drawing stations randomly from the pool. Currently, non-duplication is enforced in these station draws, but a user may also allow duplicates as a way of representing stations with unequal nameplate capacities (i.e., a station appearing twice in a network represents a single station with twice the capacity of a baseline station). All of the stations so generated are evaluated and ranked 306 against each other and against the stations evaluated in previous iterations. The stations appearing in the top few networks (of all time, not just this iteration) are marked 308 to be kept in the next iteration, and the remainder will be replaced.

With continuing reference to FIG. 3, the exact number of stations to be kept in the pool from one iteration to the next varies throughout the calculation according to a schedule chosen at the beginning of the calculation. Initially, only the stations in the best network are kept. As the calculation progresses more and more stations are kept until eventually only a single station is being retained. Thereafter, the size of the station pool may be reduced, still replacing only a single station at each iteration. By the end of the calculation, the pool is just one station larger than the network size, and all but a single station is kept. Accordingly, a very broad search, in which a lot of new stations are selected at random in every iteration, proceeds to a very narrow search, in which the best network is kept and new networks are generated by replacing individual stations.

A typical optimization run evaluates the power generation on the order of $10^9$ networks of wind and/or solar farms. These calculations make several simplifying assumptions in order to speed up the individual availability calculations. Once the optimization process has identified a small number (10-20) of candidate networks, a more comprehensive evaluation is performed for each network. This evaluation includes a detailed calculation of power generation, both raw and usable as well as statistics of ramping events.

Scoring Metrics

Any optimization problem requires a scoring metric in order to evaluate networks of wind and/or solar farms. The evaluation 112 (and optimization 114) performed by embodiments of the renewable energy network optimization described herein, e.g., as in method 100 of renewable energy network optimization described above or as illustrated by evaluating and ranking 306 in FIG. 3, may utilize scoring metrics described herein.

Embodiments of the renewable energy network optimization tool use a scoring metric which optimizes on usable power. Usable power is an estimate of that amount of power that can be reliably counted on by minimizing impacts of curtailment as well as the dependency on weather forecasts of wind and clouds. In this case curtailment represents an approximation to the excess power that can not be sold on market and therefore has to be dumped. This would be due to short-term fluctuations in power generation over the course of an hour, for example. The other consideration is the reliance on weather prediction. Prediction reflects the ability to forecast tomorrow's power generation. In general, networks with little curtailment and that produce more consistent, non-varying power day after day will be favored. Below are defined three scoring metrics for wind (M1, M2, M3) and three scoring metrics for solar (S1, S2, S3). The M3 and S3 metrics define the optimization metric referred to as usable power.

Wind Specific Metrics

Power from the station is the result of the solar or wind calculation for the location and time.

$p_{ij}$=Power from station i at time index j $i \in \{1 \ldots N\}, j \in \{1 \ldots T\}$ Summation over all stations at time j is the network power $$P_j = \sum_{i=1}^{N} p_{i,j}$$

Maximum power generated by any station at time j over the network $$Q_j = \max_{i=1,N} \{p_{ij}\}$$

In this case, the metric is designed to produce a network that narrows in on the single best location for power production, on the mean.

$$M1 = \frac{1}{T} \sum_{j=1}^{T} P_j$$

In the case of M2, the metric is designed to produce a network that widens out to a maximally diverse network, even at the expense of very poor aggregate power.

$$M2 = \frac{1}{T} \sum_{j=1}^{T} Q_j$$

The running minimum network sum-power over a trailing time window (K+1 steps wide).

$$R_j^K = \min_{k=0,K} \{P_{j-k}\}$$

The trailing H-step mean of the running K-step trailing minimum. This will be a proxy for a day-ahead forecast with H set to enough time-steps to cover 24 hours (In principal, this could be set to any time length).

$$\overline{R}_j^{H,K} = \frac{1}{H} \sum_{k=1}^{H} R_{j-k}^K$$

The M3 metric caps utility at no more than the previous day's average power, and accounts for time-to-time variability over a shorter window. Networks that consistently produce power from day to day and time to time will be favored.

$$M3 = \frac{1}{T}\sum_{j=1}^{T} \min(R_j^K, \overline{R}_j^{H,K})$$

The metrics, M1, M2, and M3 represent a basic set that should span the space for testing of the method for providing a renewable energy network optimization tool. Refinements could include better representations of ramping costs, better day-ahead forecast proxies, and season/hourly weights by electrical demand.

Solar Specific Metrics

The amount of power from the station that would be produced under a perfectly clear sky is as follows:

$s_{ij}$=Clear sky power from station i at time index j

The sum of predicted power over all stations in the network:

$$S_j = \sum_{i=1}^{N} s_{i,j}$$

S1 is this sum of outputs of the individual stations in the network (analogous to M1). S2 is the max of the individual station outputs, calculated in the same manner as M2. Indicator flag for the network, showing whether it potentially produces power or not:

$$w_j = \begin{Bmatrix} 1 : S_j > 0 \\ 0 : S_j \leq 0 \end{Bmatrix}$$

Fractional output level of the network is the fraction of the potential clear-sky power that is produced:

$$f_j = \begin{Bmatrix} \frac{P_j}{S_j} : S_j > 0 \\ 0 : S_j \leq 0 \end{Bmatrix}$$

Minimum fractional power produced by the network over the trailing K time steps for those time when it could have produced power:

$$F_j^K = \min_{\substack{k=0,K \\ \{w_{j-k}=1\}}} \{f_{j-k}\}$$

The trailing H-step average of the minimum fractional power for those times when the network could have been producing power.

$$\overline{F}_j^{H,K} = \begin{Bmatrix} \dfrac{\sum_{k=1}^{H} F_{j-k}^K}{\sum_{k=1}^{H} w_{j-k}} : \sum_{k=1}^{H} w_{j-k} > 0 \\ 0 : \sum_{k=1}^{H} w_{j-k} > 0 \end{Bmatrix}$$

The corresponding S3, solar metric caps utility at no more than the previous 24-hour average power fraction times the current clear-sky power potential, excluding times when the network cannot produce power, and accounts for time-to-time variability over a shorter window by using the lowest fractional power output over last K-steps at each time. Networks that consistently produce power from day to day and time to time will be favored.

$$S3 = \frac{1}{T}\sum_{j=1}^{T} \min(F_j^K, \overline{F}_j^{H,K}) S_j$$

The K-steps (e.g., four (4) fifteen (15) minutes steps) trailing average assures that rapidly ramping power levels create a poor value, favoring short term steady power output. The 24 hour average is a proxy of a next day's forecasted power output, favoring networks with high day-to-day persistence accuracy, which reasonably implies a network with a better day-ahead forecastability.

Figure 4:
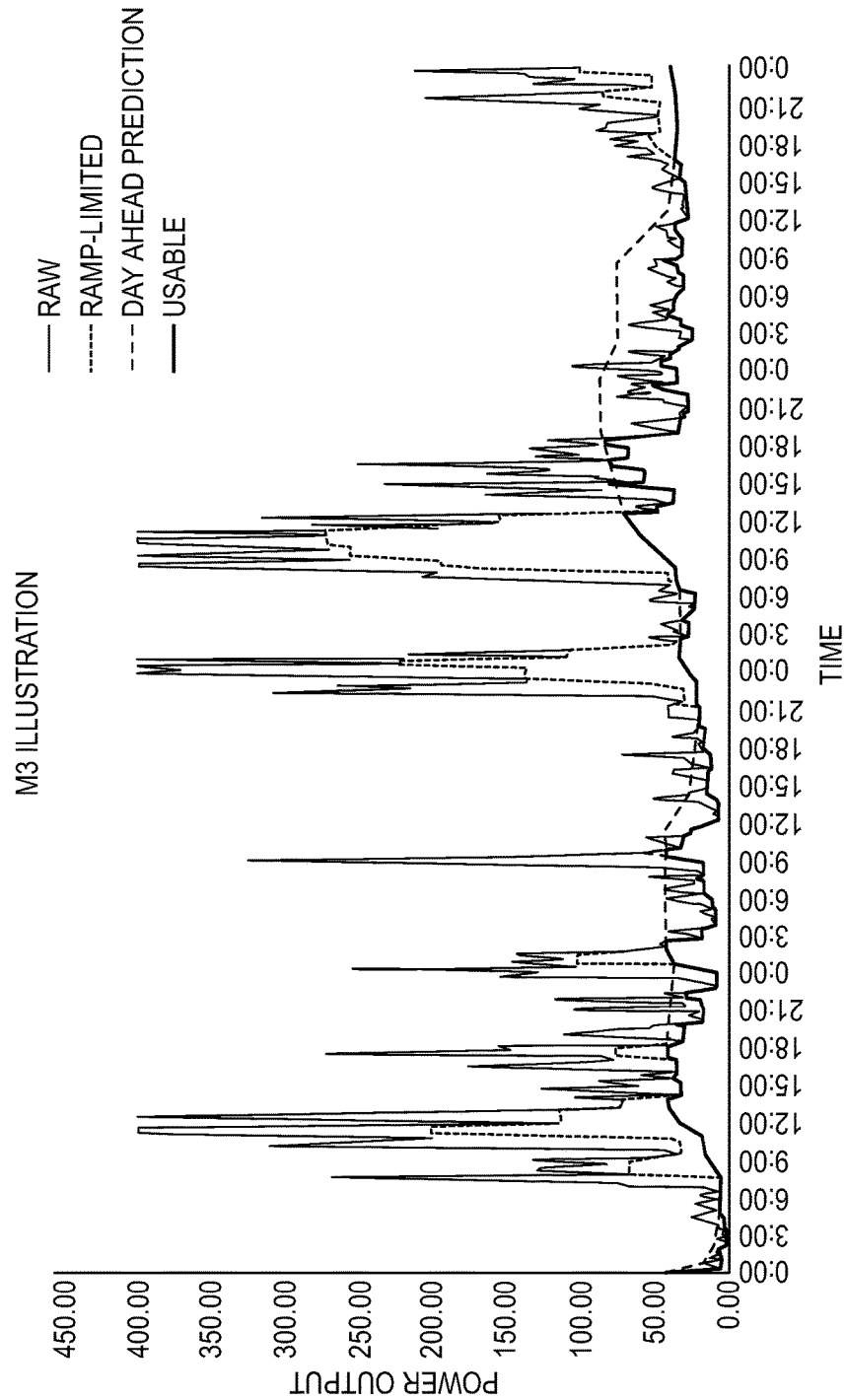
FIG. 4 is a graph chart illustrating an exemplary M3 scoring metric utilized by an embodiment of the renewable energy network optimization tool.

A graphical illustration of an application of the M3 metric that may be utilized by an embodiment of the renewable energy network optimization tool is shown in FIG. 4. A graphical illustration of an application of the S3 metric would be analogous to the illustration in FIG. 4. Generally speaking, M3 and S3 are used to model real energy systems using the renewable energy network optimization tool, while S1/M1 and S2/M2 are used to test and debug embodiments of the renewable energy network optimization tool. One of ordinary skill in the art may develop and use variations of M3 and S3 or similar metrics to model real energy systems using the renewable energy network optimization tool.

The raw power of the network is shown by the "raw" solid line as a function of time. The short-term variability of power due to rapid fluctuations is shown as the "ramp-limited" dashed line in FIG. 5. The proxy for the day ahead prediction is given in the "day ahead prediction" bolded dashed line. The usable power is simply the minimum of the previous two (shown as the "usable" bolded solid line). In this case the usable power is that power that which is limited by short-term curtailment and the ability to predict tomorrows generation. Networks with large usable power will be favored by the optimization.

Embodiments of the renewable energy network optimization tool can accommodate numerous constraints (e.g., number of sites, the geographic extent of the optimization, proximity to high-voltage transport lines, terrain constraints, population constraints). This capability is critical because of the practicalities of siting wind and/or solar farms. In some cases the optimal set of geographically diverse sites may not be practical due to issues stated above. If those constraints are factored in then a more reliable and defendable network can be found.

Summary

Embodiments of the renewable energy network optimization have been developed to assist in the optimal placement of networks of wind and/or solar farms. Embodiments of the renewable energy network optimization tool optimize site selection to maximize usable power, by minimizing power intermittency and maximizing base load power of the system. Embodiments take into consideration constraints on placement such as: location of transmission lines, population density, land costs and others. Use of this tool can assist in minimizing the conventional energy reserve requirements of the utility industry. In addition, embodiments of the renewable energy network optimization tool provide a powerful tool that can assist policy makers, regulators, regional public stakeholders, transmission operators, and individual renewable operators and investors.

Finally, the development of high resolution regional climate simulations through dynamic downscaling is being performed to understand future wind, cloud, and temperature patterns and their impacts on existing and future renewable energy production capability. Running the renewable energy network optimization tool on these future data sets allows a user to select sites optimized for tomorrow's climate, rather than yesterday's. Case studies of both a wind and solar farm optimization are shown below.

The power of supercomputing, advanced meso-scale atmospheric and high resolution regional climate modeling, and high-fidelity meteorological data may be leveraged by embodiments to offer a new service called maximizing and optimizing renewable energy (MORE) power, also known as the renewable energy network optimization tool (ReNOT). Accordingly, embodiments reduce the financial risk in renewable energy project development by selecting the best combination of locations for either wind and/or solar farm placements that will result in the highest generation and lowest aggregate intermittency of power.

Embodiments of the renewable energy network optimization tool accomplish this by integrating historical wind or solar data with topographic and land cover information to evaluate twelve (12) $km^2$ grids (four (4) $km^2$ for clouds) within a defined geographic area, such as a state or county, to determine which site placements will generate the most power with the least variance in production. Rather than relying solely on predictive wind models, embodiments of the renewable energy network optimization tool use a sophisticated optimization process along with high performance computing to evaluate billions of combinations of sites that meet the performance criteria set forth. The process is based on an assumption that geographical diversity will lower intermittency, thereby maximizing usable power and minimizing firming requirements.

Embodiments of the renewable energy network optimization tool also include a high resolution regional climate change simulation to calculate how evolving climatic conditions will impact the energy production potential of each site's asset lifecycle (up to fifty (50) years). The result is a multi-site wind or solar energy project eligible for favorable financing terms due to its superior power variance score. Once built, the project can save millions in operating costs related to firming contracts thanks to the low intermittency in power generation.

Case Studies

A study was performed using embodiments of the renewable energy network optimization tool to show the value that geographic diversity brings in addressing the variability issue. As a user optimizes over larger and larger geographic areas, capacity factors increase and variability (power ramping) decreases. The study, utilizing an embodiment, was performed to estimate the optimal locations of a network of wind farms. In addition a study to exercise a proof of concept for a solar application was also performed. The following highlights the results from each study.

Wind Application

With reference now to FIG. 5, the objective of the first study was to determine whether a four site of wind farms with a nameplate capacity of 374 MW could be found that was superior to an existing four site network with identical name plate capacity. In the study, embodiments of the renewable energy network optimization tool were setup to allow only locations in the state of Montana 500. Comparisons were made to four existing wind farm locations 502 including Glacier with a 210 MW name plate capacity, Horseshoe Bend with a total capacity of nine (9) MW, Diamond Willow with a capacity of twenty (20) MW and Judith Gap with a total capacity of 135 MW. In the wind study, a cost function was developed that emphasized network stability, total power and day ahead forecastability. In other words, networks with more consistent day-to-day cloud cover and that were more accurately forecastable by a day in advance will be favored by embodiments of the renewable energy network optimization tool.

Three different metrics for utilization by an embodiment of the renewable energy network optimization tool were developed in which to pick sites. Metric 1 (M1) chooses sites that converge on the single best location for power production, on average. Metric 2 (M2) picks sites that maximize geographical diversity, even at the expense of very poor aggregate power. Metric 3 (M3) picks sites based on the previous day's mean power, and accounts for short-term variability (i.e., one (1) hour). In a sense, M3 attempts to approximate usable power by minimizing ramping events which are so important to industry. In addition, several performance metrics are investigated, including Mean Power, Usable Power, and ramping event frequency. A ramping event is defined as an increase or decrease in power production over the course of one hour. Of interest was the frequency of ramping events that exceeded ten percent (10%) of total capacity for the network. Networks with few ramping events are markedly superior to networks producing otherwise identical aggregate power.

Figure 6A:
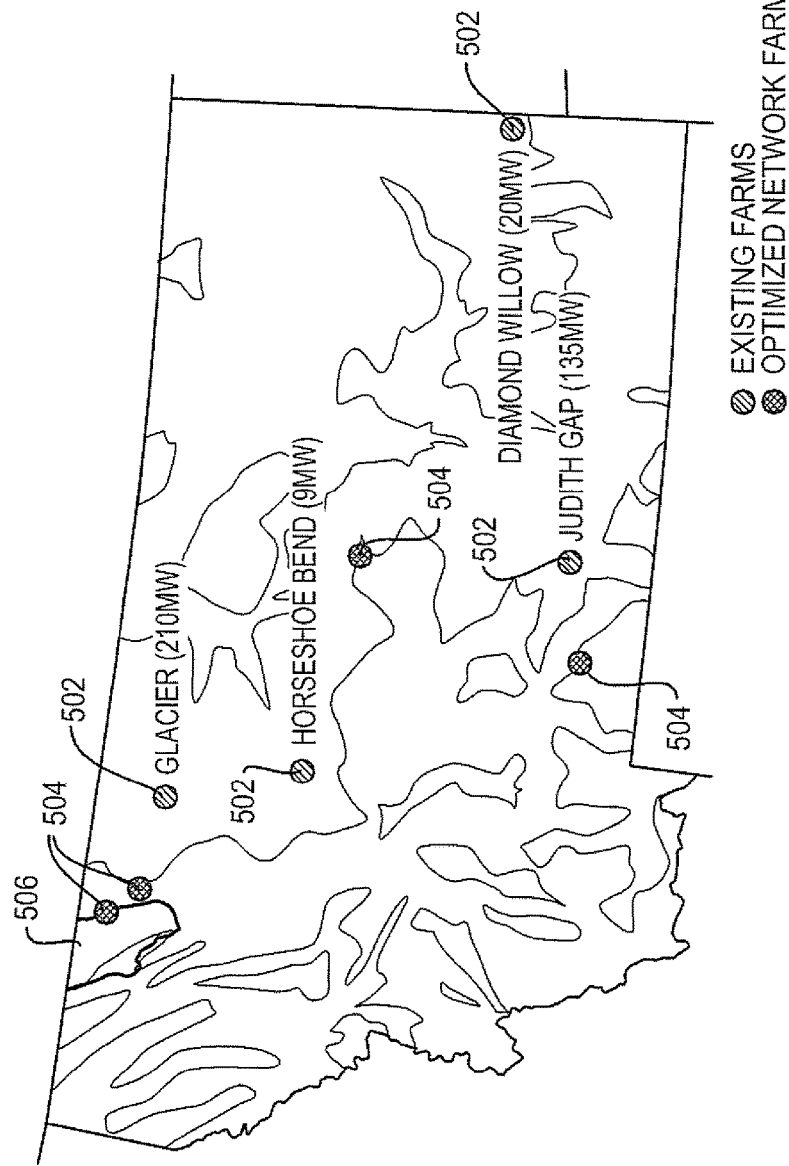
FIG. 6A is a diagram illustrating exemplary results generated by an embodiment of the renewable energy network optimization tool, showing an exemplary optimal network.

With reference now to FIG. 6A, the optimization was run over the fifteen (15) year period (1995-2009) of hub-height wind data (forty (40) meters AGL). The optimization was performed using an embodiment of the renewable energy network optimization tool, e.g., executing method 100 using data, metrics and optimization described above. FIG. 6A indicates the existing wind farms 502 and optimized network locations 504 resulting from such optimization. The renewable energy network optimization tool derived network would have produced fifty-eight percent (58%) more usable power than the four (4) existing and operating wind farms 502. In addition, the optimized four site 504 network would have produced three times fewer significant ramping events. Note that the configuration of the optimized network contains two sites 504 that are relatively close together but just downwind of Glacier National Park (shown in the outlined area 506 in the upper left corner). The other two sites 504 have much more geographical diversity. This indicates the optimization was able to find a tradeoff between peak power and more consistent day to day power.

FIG. 6B shows statistics from an application of optimization method 100 executed by an embodiment of the renewable energy network optimization tool. Raw power from the networks (existing and optimized) are shown as well as the usable power (i.e., M3 metric) approximation for the networks. In addition, the frequency that the networks exceeded ten percent (10%) of the total name plate capacity (i.e., ramping) are shown. The first two rows show these values (raw power, usable power and frequency of ramping) of the existing four sites a) using their original nameplate capacity configuration in the first row and b) assuming each site has the same name plate capacity in the second row. The remaining four rows show the optimized network described above, with each row having different combinations of name plate capacity. The first configuration (seen in the third row), named closest network, is that network whose individual nameplate capacity was closest in distance to the existing sites. The second configuration (seen in the fourth row) was that network which produced the highest raw power, the third configuration (seen in the fifth row) was the network which produced the highest stability and the fourth configuration (seen in the sixth row) assumed each site in the optimized network had equal name plate capacity of 93.5 MW. As FIG. 6B indicates the usable power is on the order of twenty to twenty-five percent (20%-25%) lower than the raw power but it is believed that the usable power approximation is that power which is much more reliable and dependable to the market. In addition, despite the different nameplate capacity configurations, the optimized network would have produced about fifty-eight percent (58%) more usable power than the existing four-site network. Ramping events at the ten percent (10%) level were also much less common for the optimized networks compared with the existing networks. A calculation of the network capacity factor (NCF) was computed for the existing and optimized network. The NCF is analogous to the site capacity factor used by the industry today but in this case it represents the ratio of the total usable power for the network to its nameplate capacity. In this case the NCF was 0.17 and 0.27 for the existing 502 and optimized networks 504, respectively.

Solar Application

With reference now to FIG. 7A, a solar study was performed to find an optimal set of four solar farms on the central and southern regions of the peninsula of Florida. The optimization was performed over a fifteen (15) year period of data (1995-2009) using a GOES derived cloud analysis at four (4) km and fifteen (15) minute resolution, respectively. The optimization was performed using an embodiment of the renewable energy network optimization tool, e.g., executing method 100 using data, metrics and optimization described above. See "758: Applications of the Renewable Energy Network Optimization Tool (ReNOT) for use by Wind & Solar Developers: Part II," Alliss et. al. (2011) ("Alliss II"), which is hereby incorporated by reference. As with the Montana wind study, a cost function was developed that emphasized network stability, total power and day ahead forecastability. Networks with more consistent day-to-day cloud cover and that were more accurately forecastable by a day in advance will be favored by embodiments of the renewable energy network optimization tool.

Figure 8:
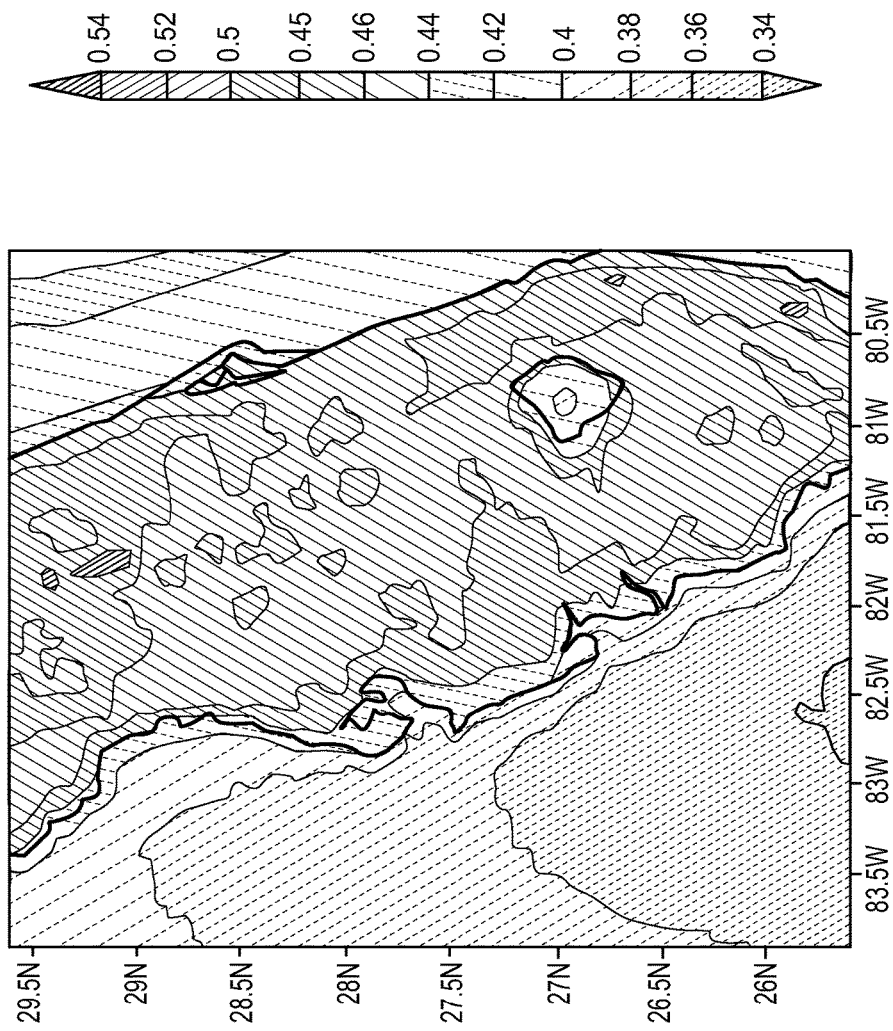
FIG. 8 is a diagram illustrating exemplary mean cloud fractions over the peninsula of Florida between 1995 and 2009.

With reference again to FIG. 7A, shown is a map of Florida 700 showing the results of the optimization. Results were compared to an existing/proposed set of four sites 702 (two of which are proposed currently). The existing/proposed sites are located at Cape Canaveral, Fla. 702 (one site=ten (10) MW), Desoto, Fla. 702 (three sites=twenty-five (25) MW total) and two (2) additional yet to be located sites (each with fifty-five (55) MW) for a total name plate capacity of 145 MW. These existing/proposed sites 702 are represented by x's on the map. The three top optimized networks 704 are shown by different sized dots. These three networks 704 had the highest S3 (analogous to M3) score as indicated in the legend. Embodiments of the renewable energy network optimization tool place the optimal networks 704 along the west coast of Florida 700 and would have produced approximately ten percent (10%) more usable power than the existing/proposed sites 702. This result is mainly due to the minimum in cloud cover along the west coast of Florida as shown in FIG. 8. Interestingly, the renewable energy network optimization tool simulation would have picked sites over the water but this was prohibited by the land-sea-lake mask used in the code. The influence of correlations is partially minimized by the restricted optimization area (square bounding box in FIG. 7A) and the strong minimum in clouds observed along the west coast. All three networks 704 would have produced a usable power of approximately eighty-five (85) MW compared to the 145 MW name plate capacity. This would have produced a NCF of approximately fifty-nine percent (59%). The existing/proposed sites 702 produce a NCF slightly less than fifty-four percent (54%). Ramping events (as measured at the ten percent (10%) ramping level) in the optimized networks 704 would have been nearly equal to those of the existing/proposed sites 702 (as shown in FIG. 7B) at approximately thirty-four percent (34%) of the time.

The runs performed in this study were made without regard to other practical restrictions for example, building in state parks, population centers or within proximity to electrical grid infrastructure. However, the capability to account for such factors may be included in embodiments of the renewable energy network optimization tool.

FIGS. 9A and 9B show the probability of exceeding different usable power values for the (a) optimized network and the (b) existing/proposed network. These statistics are based on the entire fifteen (15) year period of data. Results show the optimized network would have provided a higher P90 value particularly at noon then the un-optimized network. Note, a P value indicates the probability of power output exceeding a given value. So a P90 value is the value at which there is a ninety percent (90%) probability that the power output will equal or exceed the value. For example, as shown in FIGS. 9A and 9B, the P90 value is 33.95 MW between 7 AM and 8 AM; i.e., there is a ninety percent (90%) probability that the power output will be at least 33.95 MW between 7 AM and 8 AM. Likewise, the P90 value between 1 PM and 2 PM is 77.10 MW.

To investigate the impact of satellite resolution might have on the results, a one (1) km cloud climatology is constructed based on daytime GOES visible imagery for the year 2009. The usable power from the optimized networks is evaluated using the original four (4) km dataset for 2009 only as well as the one (1) km dataset. The results are shown in FIG. 10.

In general, the one (1) km dataset was clearer in 2009 compared with the four (4) km dataset by approximately five to eight percent (5-8%). This is not surprising since at one (1) km resolution it is possible to see the holes that exist between the convective clouds which are dominant in this part of the state. The holes are not as resolvable at four (4) km resolution. The impact on usable power for both networks is increase by seven to eight percent (7-8%). This indicates that it may be more advantageous to develop a full fifteen-year climatology of clouds to get a better representation of the usable power.

Summary

Embodiments of the renewable energy network optimization tool (e.g., ReNOT) assist in the optimal placement of networks of wind and/or solar farms. Embodiments of the renewable energy network optimization tool optimize site selection to maximize usable power, by minimizing power intermittency and maximizing base load power of the system. Embodiments take into consideration constraints on placement such as: location of transmission lines, population density, land costs and others. Use of embodiments of the renewable energy network optimization tool may assist in minimizing the conventional energy reserve requirements of the utility industry. In addition, embodiments of the renewable energy network optimization tool provide a powerful tool that can assist policy makers, regulators, regional public stakeholders, transmission operators, and individual renewable operators and investors. Embodiments described herein will aid in the efforts to reduce the financing and operating costs of wind and solar energy projects and accelerate investors' return on investment.

Figure 11:
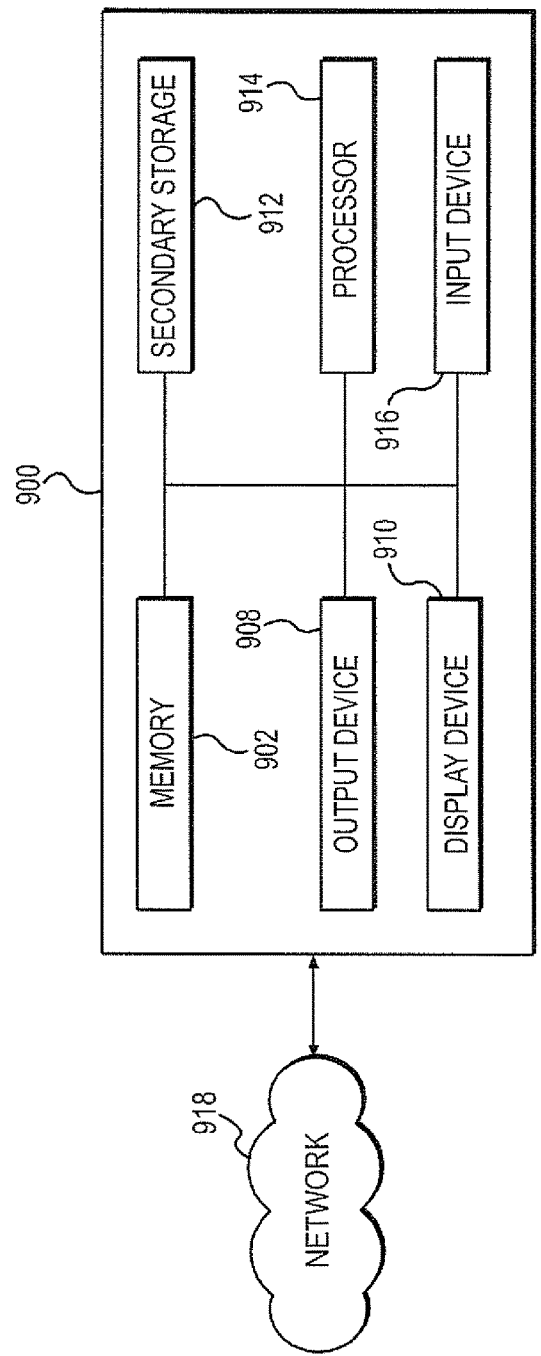
FIG. 11 is a block diagram illustrating exemplary hardware components for implementing embodiments of the system and method for implementing a renewable energy network optimization tool.

As described above, embodiments provide a renewable energy network optimization tool that may be executed in a multiprocessing computing environment in which a master thread of execution controls and coordinates optimization activities of a mass of slave execution threads. FIG. 11 is a block diagram illustrating exemplary hardware components that may be used for implementing embodiments of the system and method for providing a renewable energy network optimization tool. A server 900, or other computer system similarly configured, may include and execute programs to perform functions described herein, including steps of method described above. While only one processor 914 is shown in FIG. 11, it is understood that server 900, or other computing systems used to implement the renewable energy network optimization tool may include multiple processors. Additionally, a system for implementing the renewable energy network optimization tool may include multiple networked servers 900 or other computing systems. Further, a mobile device that includes some of the same components of computer system 900 may perform steps of the method described above. Computer system 900 may connect with a network 918, e.g., Internet, or other network, to receive inquires, obtain data, and transmit information (e.g., to a user work station or other user computing device) as described above.

Computer system 900 typically includes a memory 902, a secondary storage device 912, and a processor 914. Computer system 900 may also include a plurality of processors 914 and be configured as a plurality of, e.g., bladed servers, or other known server configurations. Computer system 900 may also include an input device 916, a display device 910, and an output device 908.

Memory 902 may include RAM or similar types of memory, and it may store one or more applications for execution by processor 914. Secondary storage device 912 may include a hard disk drive, floppy disk drive, CD-ROM drive, or other types of non-volatile data storage. Processor 914 may include multiple processors or include one or more multi-core processors. Any type of processor 914 capable of performing the calculations described herein may be used. Processor 914 may execute the application(s) that are stored in memory 902 or secondary storage 912, or received from the Internet or other network 918. The processing by processor 914 may be implemented in software, such as software modules, for execution by computers or other machines. These applications preferably include instructions executable to perform the functions and methods described above and illustrated in the Figures herein. The applications may provide graphic user interfaces (GUIs) through which users may view and interact with the application(s).

Also, as noted, processor 914 may execute one or more software applications in order to provide the functions described in this specification, specifically to execute and perform the steps and functions in the methods described above. Such methods and the processing may be implemented in software, such as software modules, for execution by computers or other machines.

Input device 916 may include any device for entering information into computer system 900, such as a touch-screen, keyboard, mouse, cursor-control device, microphone, digital camera, video recorder or camcorder. Input device 916 may be used to enter information into GUIs during performance of the methods described above. Display device 910 may include any type of device for presenting visual information such as, for example, a computer monitor or flat-screen display (or mobile device screen). Output device 908 may include any type of device for presenting a hard copy of information, such as a printer, and other types of output devices include speakers or any device for providing information in audio form.

Examples of computer system 900 include dedicated server computers, such as bladed servers, personal computers, laptop computers, notebook computers, palm top computers, network computers, mobile devices, or any processor-controlled device capable of executing a web browser or other type of application for interacting with the system. If computer system 900 is a server, server 900 may not include input device 916, display device 910 and output device 908. Rather, server 900 may be connected, e.g., through a network connection to a stand-alone work station (another computer system) that has such devices.

Although only one computer system 900 is shown in detail, the system for providing a renewable energy network optimization tool may use multiple computer systems or servers as necessary or desired to support the users, as described above. Embodiments may also use back-up or redundant servers to prevent network downtime in the event of a failure of a particular server. In addition, although computer system 900 is depicted with various components, one skilled in the art will appreciate that the server can contain additional or different components. In addition, although aspects of an implementation consistent with the above are described as being stored in memory, one skilled in the art will appreciate that these aspects can also be stored on or read from other types of computer program products or computer-readable media, such as secondary storage devices, including hard disks, floppy disks, or CD-ROM; or other forms of RAM or ROM. Computer-readable media may include instructions for controlling a computer system, such as the computer system 900, to perform a particular method, such as methods described above.

The terms and descriptions used herein are set forth by way of illustration only and are not meant as limitations. Those skilled in the art will recognize that many variations are possible within the spirit and scope of the invention as defined in the following claims, and their equivalents, in which all terms are to be understood in their broadest possible sense unless otherwise indicated.

What is claimed is:
1. A method for optimizing a renewable energy network, comprising:
 (a) determining an initial configuration state, wherein initial configuration state includes information about any renewable energy candidate sites kept from a prior iteration, if any;

(b) populating a pool of candidate sites for placement of renewable-energy generating units using a hybrid simulated annealing-genetic algorithm, wherein the populating includes:
adding identified kept sites; and
adding candidate sites by quasi-random geographical selection;
(c) constructing a plurality of candidate renewable energy generation networks from the pool of candidate sites using random selection;
(d) evaluating the candidate renewable energy generation networks using scoring metrics;
(e) ranking the evaluated candidate renewable energy generation networks with respect to each other and prior iteration candidate renewable energy generation networks;
(f) adding candidate sites from a top ranked candidate renewable energy generation network to a list of candidate sites to be kept;
repeating (a)-(f) until a final best candidate renewable energy generation network of kept sites is determined; and
outputting the final best candidate renewable energy generation network for review, in which the outputting outputs the final best candidate renewable energy generation network for display on computing device display,
wherein the constructing constructs candidate renewable energy generation networks without replacement to ensure sites from the pool candidate sites are not repeated within a single candidate network.

2. The method of claim 1 wherein the final best candidate renewable energy generation network of kept sites is determined when the flagging does not flag any additional kept sites.

3. The method of claim 1 wherein the evaluating includes micro-optimizing of allocated capacities within the allowed constraints for each candidate site.

4. The method of claim 3 wherein the micro-optimizing maximizes the score for the specific site configuration while meeting constraints on minimum and maximum capacity per site.

5. The method of claim 4 wherein the constraints are user-specified.

6. The method of claim 3 wherein the micro-optimizing uses a variety of scoring metrics to generate a score for each site.

7. The method of claim 1 wherein the adding adds candidate sites from a second-ranked candidate renewable energy generation network to a list of candidate sites to be kept.

8. The method of claim 1 wherein the evaluating includes a consideration of practical restrictions on the placement of candidate sites including restrictions against building in parks or population centers and necessary proximity to electrical grid infrastructure.

9. The method of claim 1 wherein the outputting outputs the final best candidate renewable energy generation network over a network.

10. A method for optimizing a renewable energy network, comprising:
(a) determining an initial configuration state, wherein initial configuration state includes information about any renewable energy candidate sites kept from a prior iteration, if any;
(b) populating a pool of candidate sites for placement of renewable-energy generating units using a hybrid simulated annealing-genetic algorithm, wherein the populating includes:
adding identified kept sites; and
adding candidate sites by quasi-random geographical selection;
(c) constructing a plurality of candidate renewable energy generation networks from the pool of candidate sites using random selection;
(d) evaluating the candidate renewable energy generation networks using scoring metrics;
(e) ranking the evaluated candidate renewable energy generation networks with respect to each other and prior iteration candidate renewable energy generation networks;
(f) adding candidate sites from a top ranked candidate renewable energy generation network to a list of candidate sites to be kept;
repeating (a)-(f) until a final best candidate renewable energy generation network of kept sites is determined; and
instantiating an instance of renewable energy network optimization tool, wherein the instance of the renewable energy network optimization tool includes a master thread and a plurality of slave threads that execute (a)-(f) and the repeating,
wherein the constructing constructs candidate renewable energy generation networks without replacement to ensure sites from the pool candidate sites are not repeated within a single candidate network.

11. A system for providing a renewable energy network optimization tool, comprising:
one or more processors; and
a memory connected to the one or more processors, wherein the memory includes instructions for optimizing a renewable energy network, by:
(a) determining an initial configuration state, wherein initial configuration state includes information about any renewable energy candidate sites kept from a prior iteration, if any;
(b) populating a pool of candidate sites for placement of renewable-energy generating units using a hybrid simulated annealing-genetic algorithm, wherein the populating includes:
adding identified kept sites; and
adding candidate sites by quasi-random geographical selection;
(c) constructing a plurality of candidate renewable energy generation networks from the pool of candidate sites using random selection;
(d) evaluating the candidate renewable energy generation networks using scoring metrics;
(e) ranking the evaluated candidate renewable energy generation networks with respect to each other and prior iteration candidate renewable energy generation networks;
(f) adding candidate sites from a top ranked candidate renewable energy generation network to a list of candidate sites to be kept; and
repeating (a)-(f) until a final best candidate renewable energy generation network of kept sites is determined,
wherein the constructing constructs candidate renewable energy generation networks without replacement to ensure sites from the pool candidate sites are not repeated within a single candidate network.

12. The system of claim 11 wherein the final best candidate renewable energy generation network of kept sites is determined when the flagging does not flag any additional kept sites.

13. The system of claim 11 wherein the evaluating includes micro-optimizing of allocated capacities within the allowed constraints for each candidate site.

14. The system of claim 11 wherein the constructing constructs candidate renewable energy generation networks without replacement to ensure sites from the pool candidate sites are not repeated within a single candidate network.

15. The system of claim 11 wherein the adding adds candidate sites from a second-ranked candidate renewable energy generation network to a list of candidate sites to be kept.

16. The system of claim 11 further comprising outputting the final best candidate renewable energy generation network for review.

17. A non-transitory computer readable medium providing instructions for optimizing a renewable energy network, by:
  (a) determining an initial configuration state, wherein initial configuration state includes information about any renewable energy candidate sites kept from a prior iteration, if any;
  (b) populating a pool of candidate sites for placement of renewable-energy generating units using a hybrid simulated annealing-genetic algorithm, wherein the populating includes:
    adding identified kept sites; and
    adding candidate sites by quasi-random geographical selection;
  (c) constructing a plurality of candidate renewable energy generation networks from the pool of candidate sites using random selection;
  (d) evaluating the candidate renewable energy generation networks using scoring metrics;
  (e) ranking the evaluated candidate renewable energy generation networks with respect to each other and prior iteration candidate renewable energy generation networks;
  (f) adding candidate sites from a top ranked candidate renewable energy generation network to a list of candidate sites to be kept; and
  repeating (a)-(f) until a final best candidate renewable energy generation network of kept sites is determined,
  wherein the constructing constructs candidate renewable energy generation networks without replacement to ensure sites from the pool candidate sites are not repeated within a single candidate network.

* * * * *